(12) United States Patent
Won et al.

(10) Patent No.: US 11,302,771 B2
(45) Date of Patent: Apr. 12, 2022

(54) DISPLAY DEVICE INCLUDING PAD ARRANGED IN PERIPHERAL AREA

(71) Applicant: SAMSUNG DISPLAY CO., LTD., Yongin-si (KR)

(72) Inventors: Sunghwan Won, Yongin-si (KR); Jongmoo Huh, Yongin-si (KR); Kyumin Kim, Yongin-si (KR); Doohyun Kim, Yongin-si (KR); Songhee Kim, Yongin-si (KR); Jeehoon Kim, Yongin-si (KR); Shinhyuk Yang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/886,876

(22) Filed: May 29, 2020

(65) Prior Publication Data
US 2021/0028272 A1    Jan. 28, 2021

(30) Foreign Application Priority Data

Jul. 23, 2019  (KR) .................. 10-2019-0089201

(51) Int. Cl.
*H01L 29/08*     (2006.01)
*H01L 27/32*     (2006.01)

(52) U.S. Cl.
CPC ........ *H01L 27/3279* (2013.01); *H01L 27/322* (2013.01); *H01L 27/3262* (2013.01); *H01L 27/3265* (2013.01)

(58) Field of Classification Search
CPC ............ H01L 27/3279; H01L 27/3262; H01L 27/3265; H01L 27/322
See application file for complete search history.

(56) References Cited

U.S. PATENT DOCUMENTS

| | | | |
|---|---|---|---|
| 10,096,744 B2 | 10/2018 | Coe-Sullivan et al. | |
| 2014/0353644 A1* | 12/2014 | You ..................... | H01L 27/3258 257/40 |
| 2016/0329392 A1* | 11/2016 | Miyake ................. | H01L 27/124 |
| 2017/0062548 A1* | 3/2017 | Han .................... | H01L 51/5228 |
| 2017/0155088 A1* | 6/2017 | Kim .................... | H01L 27/3276 |

(Continued)

FOREIGN PATENT DOCUMENTS

| | | |
|---|---|---|
| KR | 10-2016-0033571 | 3/2016 |
| KR | 10-2016-0075966 | 6/2016 |

(Continued)

*Primary Examiner* — Phuc T Dang
(74) *Attorney, Agent, or Firm* — F. Chau & Associates, LLC

(57) ABSTRACT

A display device includes a substrate including a display area and a peripheral area outside the display area, a thin-film transistor arranged in the display area, a display element arranged in the display area, an interlayer insulating layer covering the thin-film transistor, a conductive layer arranged above the interlayer insulating layer, a first insulating layer covering the conductive layer, a pad arranged in the peripheral area, and a second conductive layer covering a central portion of the pad. The pad is connected to a connection line through a contact hole, and the connection line is arranged on a same first layer as a gate electrode of the thin-film transistor. A side surface of the pad is covered by the first insulating layer or the second conductive layer.

19 Claims, 17 Drawing Sheets

(56) References Cited

U.S. PATENT DOCUMENTS

2017/0194790 A1* 7/2017 Kim .................... H02J 13/0079
2018/0122877 A1  5/2018 Beak et al.
2018/0337367 A1* 11/2018 Tomioka ............. H01L 51/5203
2019/0165048 A1* 5/2019 Kim ...................... G06F 3/0443

FOREIGN PATENT DOCUMENTS

| KR | 10-2018-0047588 | 5/2018 |
|----|-----------------|--------|
| KR | 10-1936625      | 1/2019 |

* cited by examiner

DISPLAY DEVICE INCLUDING PAD ARRANGED IN PERIPHERAL AREA

CROSS-REFERENCE TO RELATED APPLICATIONS

This application claims priority under 35 U.S.C. § 119 to Korean Patent Application No. 10-2019-0089201, filed on Jul. 23, 2019 in the Korean Intellectual Property Office, the disclosure of which is incorporated by reference herein in its entirety.

TECHNICAL FIELD

Exemplary embodiments relate to a display device, and more particularly, to a display device having improved reliability.

DISCUSSION OF THE RELATED ART

A display device typically includes a substrate having a display area and a peripheral area. In the display area, scan lines and data lines are insulated from each other and a plurality of pixels are included. Each pixel includes a thin-film transistor and a pixel electrode electrically connected to the thin-film transistor. In addition, an opposite electrode commonly provided to the pixels is included in the display area. The peripheral area may include various lines transferring an electrical signal to the display area, a scan driver, a data driver, a controller, and a pad unit.

SUMMARY

Exemplary embodiments include a display device capable of preventing defects of a pad unit arranged in a peripheral area, while also implementing a high quality image in a display area. However, the present disclosure is not limited thereto.

According to an exemplary embodiment, a display device includes a substrate including a display area and a peripheral area outside the display area, a thin-film transistor arranged in the display area, a display element arranged in the display area, an interlayer insulating layer covering the thin-film transistor, a conductive layer arranged above the interlayer insulating layer, a first insulating layer covering the conductive layer, a pad arranged in the peripheral area, and a second conductive layer covering a central portion of the pad. The pad is connected to a connection line through a contact hole, and the connection line is arranged on a same first layer as a gate electrode of the thin-film transistor. A side surface of the pad is covered by the first insulating layer or the second conductive layer.

In an exemplary embodiment, the pad includes a first pad layer on a same second layer as a source electrode of the thin-film transistor, and a second pad layer on a same third layer as the conductive layer. The first insulating layer has an opening hole exposing a central portion of the second pad layer. The second conductive layer is in contact with the second pad layer through the opening hole of the first insulating layer.

In an exemplary embodiment, the second conductive layer includes titanium (Ti).

In an exemplary embodiment, the pad includes a metal having higher electrical conductivity than that of the second conductive layer.

In an exemplary embodiment, the display device further includes a connection electrode connecting a drain electrode of the thin-film transistor to a pixel electrode of the display element. The connection electrode includes a same material as the second conductive layer.

In an exemplary embodiment, the pad includes a first pad layer on a same second layer as a source electrode of the thin-film transistor. The first insulating layer and the interlayer insulating layer include opening holes corresponding to a central portion of the first pad layer. The second conductive layer is in contact with the first pad layer through the opening holes of the first insulating layer and the interlayer insulating layer.

In an exemplary embodiment, the pad includes a first pad layer on a same second layer as a source electrode of the thin-film transistor. The second conductive layer is arranged on the first pad layer. The first insulating layer and the interlayer insulating layer cover side surfaces of the second conductive layer and the first pad layer.

According to an exemplary embodiment, a display device includes a substrate including a display area and a peripheral area outside the display area, a thin-film transistor arranged in the display area, a display element arranged in the display area, a pad arranged in the peripheral area, and a second conductive layer covering a side surface and an upper surface of the pad. The pad is connected to a connection line through a contact hole, and the connection line is arranged on a same first layer as a gate electrode of the thin-film transistor.

In an exemplary embodiment, the second conductive layer includes titanium (Ti).

In an exemplary embodiment, the display device further includes a storage capacitor arranged in the display area. A first electrode of the storage capacitor is arranged on the same first layer as the gate electrode of the thin-film transistor, and a second electrode of the storage capacitor is arranged on a same second layer as a source electrode of the thin-film transistor.

In an exemplary embodiment, the display device further includes a conductive layer arranged above the thin-film transistor. A first pad layer on a same second layer as a source electrode of the thin-film transistor, and a second pad layer on a same third layer as the conductive layer, are stacked in the pad.

According to an exemplary embodiment, a display device includes a lower substrate including a display area and a peripheral area outside the display area, and a plurality of pixels arranged in the display area. Each pixel includes a thin-film transistor and an organic light-emitting diode. The display device further includes a thin-film encapsulation layer covering the organic light-emitting diodes, and including at least one inorganic encapsulation layer and at least one organic encapsulation layer. The display device further includes an upper substrate arranged above the thin-film encapsulation layer and facing the lower substrate, a pad arranged in the peripheral area, and a second conductive layer covering a central portion of the pad. A side surface of the pad is covered by the second conductive layer or a first insulating layer.

In an exemplary embodiment, the pad is connected to a connection line through a contact hole, and the connection line is arranged on a same layer as gate electrodes of the thin-film transistors.

In an exemplary embodiment, the second conductive layer includes titanium (Ti).

In an exemplary embodiment, the display device further includes a connection electrode connecting the thin-film transistor and a pixel electrode of the organic light-emitting diode in each of the pixels. The connection electrode includes a same material as the second conductive layer.

In an exemplary embodiment, the display device further includes a conductive layer arranged on the thin-film transistors and connected to the thin-film transistors through contact holes.

In an exemplary embodiment, the display device further includes a plurality of color converting layers arranged on the upper substrate and corresponding to at least a portion of the plurality of pixels, and including a plurality of quantum dots.

In an exemplary embodiment, the plurality of pixels includes a first pixel, a second pixel, and a third pixel. One of the color converting layers corresponding to the first pixel emits a red light, one of the color converting layers corresponding to the second pixel emits a green light, and none of the color converting layers are arranged in correspondence with the third pixel.

In an exemplary embodiment, the display device further includes a plurality of color filters arranged on the upper substrate and corresponding to the plurality of pixels.

In an exemplary embodiment, the organic light-emitting diodes comprised in the plurality of pixels emit a blue light.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1A:
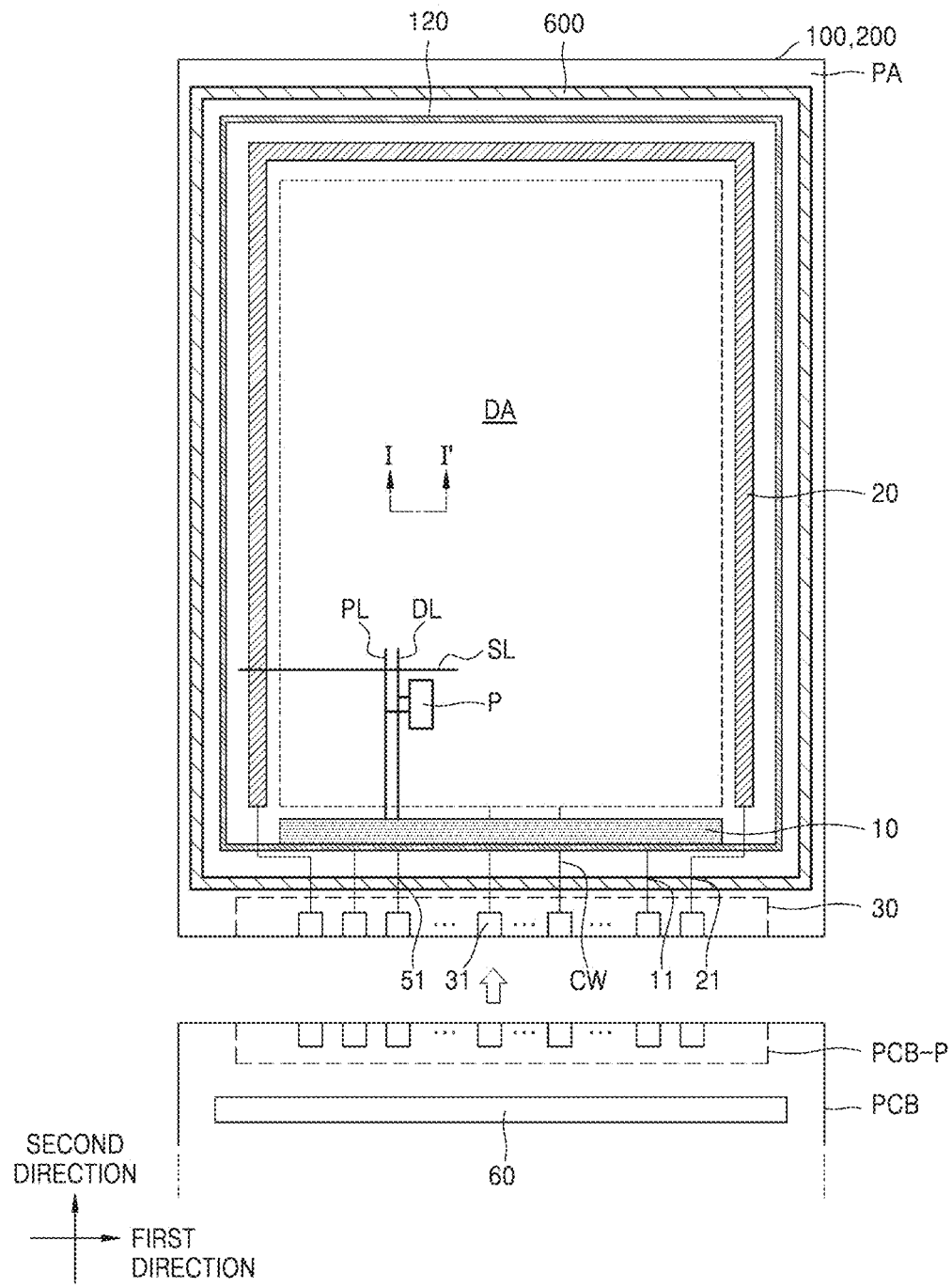
FIG. 1A is a schematic plan view of a display device according to an exemplary embodiment.

Exemplary embodiments will be described more fully hereinafter with reference to the accompanying drawings. Like reference numerals may refer to like elements throughout the accompanying drawings. As used herein, the term "and/or" includes any and all combinations of one or more of the associated listed items. Expressions such as "at least one of," when preceding a list of elements, modify the entire list of elements and do not modify the individual elements of the list.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

As used herein, the singular forms "a", "an" and "the" are intended to include the plural forms as well, unless the context clearly indicates otherwise.

In the present disclosure, it is to be understood that the terms such as "including," "having," and "comprising" are intended to indicate the existence of the features or components, and are not intended to preclude the possibility that one or more other features or components may exist or may be added.

It will be understood that when a component, such as a film, a region, a layer, or an element, is referred to as being "on", "connected to", "coupled to", or "adjacent to" another component, it can be directly or indirectly on, connected, coupled, or adjacent to the other component (e.g., intervening components may or may not be present). For example, it will be understood that when a layer, region, or component is referred to as being "connected to" another layer, region, or component, it can not only be directly electrically connected to the other layer, region, or component, but also can be indirectly electrically connected to the other layer, region, or component with other layers, regions, or components interposed between. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

A display device according to exemplary embodiments may include, for example, an organic light-emitting display device, an inorganic light emitting display device (an inorganic EL display device), a quantum dot light-emitting display device, a field emission display device, a surface-conduction electron-emitter display device, or a plasma display device.

When two or more elements are described herein as being formed of the same material, in exemplary embodiments, the material(s) of the two or more elements may be identical with no differing material(s) present among any of the two or more elements. In addition, when two or more elements are described herein as being arranged on the same layer, in exemplary embodiments, the two or more elements may be arranged directly on and directly contact this same layer, with no intervening elements or layers disposed therebetween.

It should be understood that descriptions of features or aspects within each exemplary embodiment should typically be considered as available for other similar features or aspects in other exemplary embodiments, unless the context clearly indicates otherwise.

Hereinafter, although an organic light-emitting display device is described as an example of a display device according to exemplary embodiments, the display device of the present disclosure is not limited thereto, and may be various types of display devices.

Figure 1B:
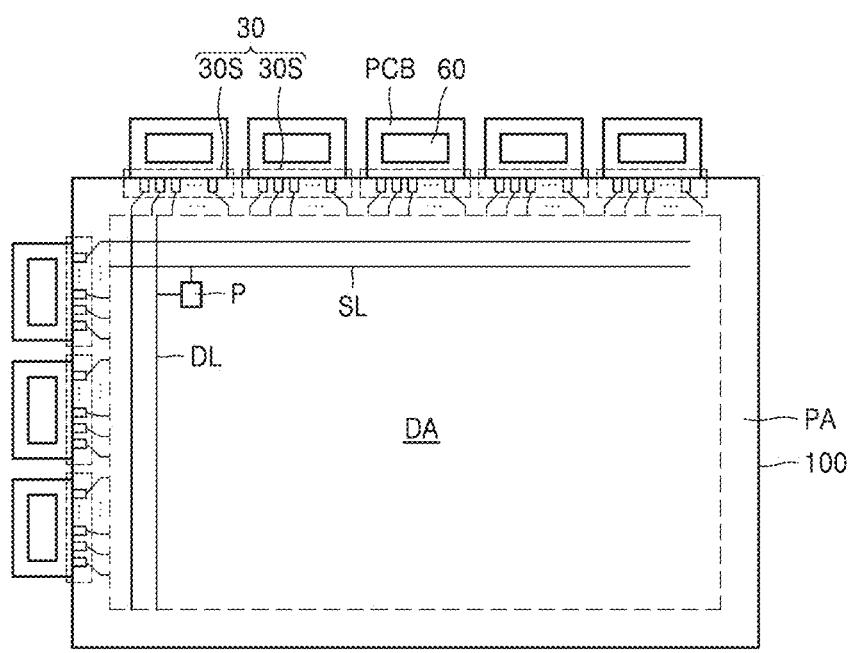
FIG. 1B is a schematic plan view of a display device according to an exemplary embodiment.

FIGS. 1A and 1B are schematic plan views of a display device according to an exemplary embodiment.

Referring to FIG. 1A, the display device may be formed by bonding a lower substrate 100 to an upper substrate 200 by a sealing member 600. The sealing member 600 may be formed to surround outer surfaces of the lower substrate 100 and the upper substrate 200 to bond the lower substrate 100 to the upper substrate 200.

The display device includes a display area DA and a peripheral area PA arranged around the display area DA. The display device DA may provide an image by using light emitted from a plurality of pixels arranged in the display area DA.

The display area DA includes a plurality of pixels P connected to a plurality of data lines DL extending in a first direction, and connected to a plurality of scan lines SL extending in a second direction crossing the first direction. Each pixel P is also connected to a driving voltage line PL extending in the first direction.

Each of the pixels P may include a display element such as, for example, an organic light-emitting diode OLED. Each pixel P may emit, for example, red, green, blue, or white light from the organic light-emitting diode OLED. The pixel P of the present disclosure may be a sub-pixel emitting any one color of red, green, blue, and white light. In exemplary embodiments, all of the organic light-emitting diodes OLED included in the pixels P may emit the same color of light, and the color of each pixel P may be implemented by, for example, a color filter arranged on an upper portion of the organic light-emitting diode OLED.

Each pixel P may be electrically connected to built-in circuits arranged in the peripheral area PA. A first power supply line 10, a second power supply line 20, and a pad unit 30 may be arranged in the peripheral area PA.

The first power supply line 10 may be arranged to correspond to one side of the display area DA. The first power supply line 10 may be connected to a plurality of driving voltage lines PL, which transfer a driving voltage ELVDD (see FIGS. 2A and 2B to be described below) to the pixel P.

The second power supply line 20 may partially surround the display area DA in a loop shape with one side open. For example, the second power supply line 20 may be disposed on three of four sides surrounding the display area DA. The second power supply line 20 may provide a common voltage to an opposite electrode of the pixel P. The second power supply line 20 may be referred to as a common voltage supply line.

The pad unit 30 may include a plurality of pads 31 and may be arranged on one side of the lower substrate 100. For example, the pad unit 30 including the plurality of pads 31 may be disposed on a lower side of the lower substrate 100, as shown in FIG. 1A. However, the present disclosure is not limited thereto. Each of the pads 31 may be connected to a first connection line 11 connected to the first power supply line 10 or may be connected to connection lines CW extending to the display area DA. The pads 31 of the pad unit 30 may be exposed by not being covered by an insulating layer, and may be electrically connected to a printed circuit board PCB. A PCB terminal unit PCB-P of the printed circuit board PCB may be electrically connected to the pad unit 30.

The printed circuit board PCB transmits a signal or power of a controller to the pad unit 30. The controller may respectively provide the driving voltage and the common voltage ELVDD and ELVSS (see FIGS. 2A and 2B to be described below) to the first and second power supply lines 10 and 20 through first and second connection lines 11 and 21.

A data driving circuit 60 is electrically connected to the plurality of data lines DL. A data signal of the data driving circuit 60 may be provided to each pixel P through the connection line CW connected to the pad unit 30 and the data line DL connected to the connection line CW. Although FIG. 1 illustrates that the data driving circuit 60 is arranged on the printed circuit board PCB, the present disclosure is not limited thereto. For example, in an exemplary embodiment, the data driving circuit 60 may be arranged above the lower substrate 100. For example, the data driving circuit 60 may be arranged between the pad unit 30 and the first power supply line 10.

A dam unit 120 may be arranged in the peripheral area PA. The dam unit 120 may prevent an edge tail of an organic encapsulation layer 420 (see FIG. 10) from being formed by blocking an organic material from flowing in an edge direction of the lower substrate 100 when forming the organic encapsulation layer 420 of a thin-film encapsulation layer 400. The dam unit 120 may be arranged in the peripheral area PA to surround at least a portion of the display area DA. The dam unit 120 may include a plurality of dams, and each dam may be spaced apart from each other when the plurality of dams are arranged. The dam unit 120 may be arranged in the peripheral area PA to be closer to the display area DA than the sealing member 600. A built-in driving circuit unit providing a scan signal of each pixel P may be further included in the peripheral area PA. In exemplary embodiments, the built-in driving circuit unit and the dam unit 120 may overlap each other.

Although FIG. 1A illustrates that one printed circuit board PCB is attached to the pad unit 30, the present disclosure is not limited thereto. For example, in an exemplary embodiment, a plurality of printed circuit boards PCB may be attached to the pad unit 30, as shown in FIG. 1B.

In addition, the pad unit 30 may be arranged along two sides of the lower substrate 100 in an exemplary embodiment, as shown in FIG. 1B. The pad unit 30 may include a plurality of sub-pad units 30S, and one printed circuit board PCB may be attached to each sub-pad unit 30S.

Figure 1C:
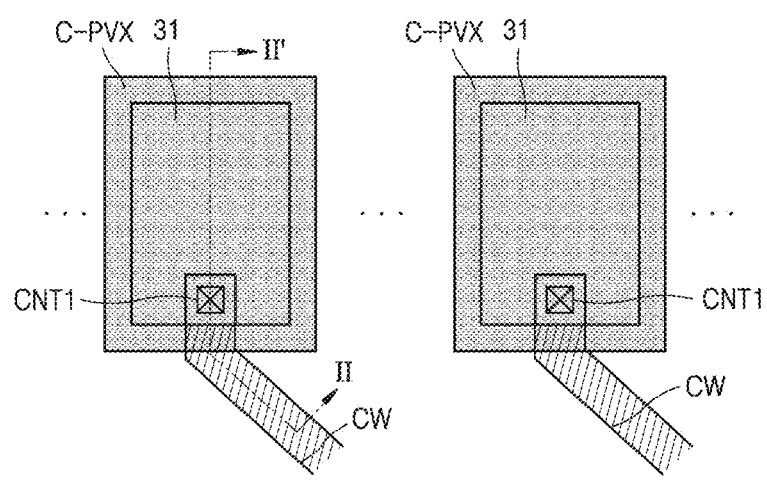
FIG. 1C is a schematic plan view of an enlarged portion of a pad unit of FIG. 1A or 1B according to an exemplary embodiment.

FIG. 1C is a schematic plan view of an enlarged portion of the pad unit 30 of FIG. 1A or 1B according to an exemplary embodiment.

Referring to FIG. 1C, the pad 31 may be connected to the connection line CW extending to the display area DA through a first contact hole CNT1, and an upper portion of the pad 31 may be covered by a second conductive layer C-PVX. The pad 31 may be formed of a metal having higher electrical conductivity than that of the second conductive layer C-PVX.

Figure 2A:
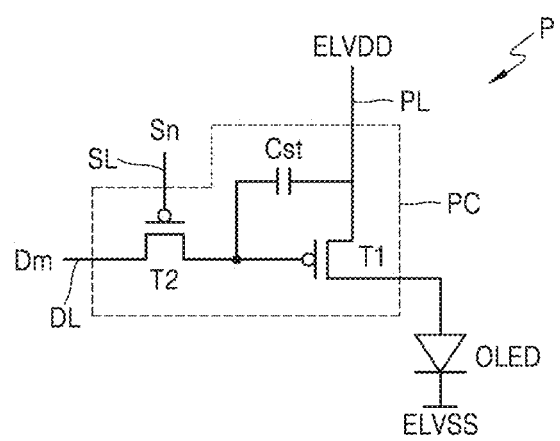
FIG. 2A is an equivalent circuit diagram of a pixel which may be included in the display device of FIGS. 1A and 1B according to an exemplary embodiment.
Figure 2B:
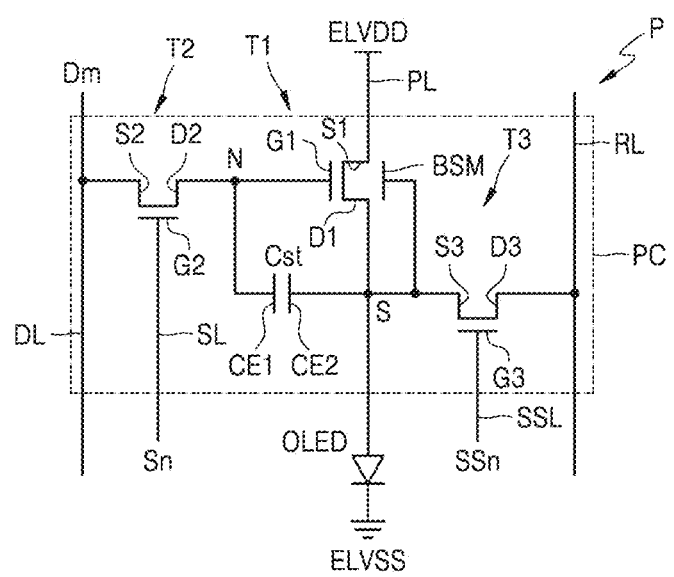
FIG. 2B is an equivalent circuit diagram of a pixel which may be included in the display device of FIGS. 1A and 1B according to an exemplary embodiment.

FIGS. 2A and 2B are equivalent circuit diagrams of a pixel P of a display device according to an exemplary embodiment.

Referring to FIG. 2A, each pixel P includes a pixel circuit PC connected to the scan line SL and the data line DL, and an organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL and delivers, to the driving thin-film transistor T1, a data signal Dm input through the data line DL, according to a scan signal Sn input through the scan line SL.

The storage capacitor Cst is connected to the switching thin-film transistor T2 and the driving voltage line PL, and stores a voltage corresponding to a difference between a voltage received from the switching thin-film transistor T2 and the first power supply voltage ELVDD (or the driving voltage) supplied to the driving voltage line PL.

The driving thin-film transistor T1 may be connected to the driving voltage line PL and the storage capacitor Cst, and may control a driving current flowing from the driving voltage line PL to the organic light-emitting diode OLED in accordance with a voltage value stored in the storage capacitor Cst. The organic light-emitting diode OLED may emit light having a certain brightness according to the driving current.

Although FIG. 2A illustrates that the pixel circuit PC includes two thin-film transistors and one storage capacitor, the present disclosure is not limited thereto.

Referring to FIG. 2B, each pixel P may include the organic light-emitting diode OLED and the pixel circuit PC including a plurality of thin-film transistors driving the organic light-emitting diode OLED. The pixel circuit PC may include the driving thin-film transistor T1, the switching thin-film transistor T2, a sensing thin-film transistor T3, and the storage capacitor Cst.

The scan line SL may be connected to a gate electrode G2 of the switching thin-film transistor T2, the data line DL may be connected to a source electrode S2 of the switching thin-film transistor T2, and a first electrode CE1 of the storage capacitor Cst may be connected to a drain electrode D2 of the switching thin-film transistor T2.

Accordingly, the switching thin-film transistor T2 supplies, to a first node N, a data voltage of the data line DL in response to a scan signal Sn from the scan line SL of each pixel P.

A gate electrode G1 of the driving thin-film transistor T1 may be connected to the first node N, a source electrode S1 of the driving thin-film transistor T1 may be connected to the driving voltage line PL transferring the driving voltage ELVDD, and a drain electrode D1 of the driving thin-film transistor T1 may be connected to an anode electrode of the organic light-emitting diode OLED.

Accordingly, the driving thin-film transistor T1 may adjust an amount of current flowing to the organic light-emitting diode OLED according to a voltage Vgs between a source and a gate of the driving thin-film transistor T1, that is, a voltage between the driving voltage ELVDD and the first node N.

A sensing control line SSL is connected to a gate electrode G3 of the sensing thin-film transistor T3, a source electrode S3 of the sensing thin-film transistor T3 is connected to a second node S, and a drain electrode D3 of the sensing thin-film transistor T3 is connected to a reference voltage line RL. In exemplary embodiments, the sensing thin-film transistor T3 may be controlled by the scan line SL instead of the sensing control line SSL.

The sensing thin-film transistor T3 may sense an electric potential of a pixel electrode (for example, an anode electrode) of the organic light-emitting diode OLED. The sensing thin-film transistor T3 may supply, to the second node S, a pre-charging voltage from the reference voltage line RL in response to a sensing signal SSn from the sensing control line SSL, or may supply, to the reference voltage line RL, a voltage of the pixel electrode (for example, the anode electrode) of the organic light-emitting diode OLED during a sensing period.

The first electrode CE1 of the storage capacitor Cst is connected to the first node N, and a second electrode CE2 of the storage capacitor Cst is connected to the second node S. The storage capacitor Cst charges a difference voltage between voltages respectively supplied to the first node N and the second node S, and supplies the charged difference voltage as the driving voltage of the driving thin-film transistor T1. For example, the storage capacitor Cst may charge a difference voltage between a data voltage Dm and a pre-charging voltage Vpre respectively supplied to the first node N and the second node S.

A bias electrode BSM may be formed to correspond to the driving thin-film transistor T1 and may be connected to the source electrode S3 of the sensing thin-film transistor T3. The bias electrode BSM may receive a voltage associated with an electric potential of the source electrode S3 of the sensing thin-film transistor T3, and thus, the driving thin-film transistor T1 may be stabilized. In exemplary embodiments, the bias electrode BSM is not connected to the source electrode S3 of the sensing thin-film transistor T3 and may be connected to a separate bias line.

The opposite electrode (for example, a cathode electrode) of the organic light-emitting diode OLED receives the common voltage ELVSS. The organic light-emitting diode OLED receives a driving current from the driving thin-film transistor T1 to emit light.

Although FIG. 2B illustrates that each pixel P includes signal lines SL, SSL, and DL, the reference voltage line RL, and the driving voltage line PL, the present disclosure is not limited thereto. For example, in an exemplary embodiment, at least one of the signal lines SL, SSL, and DL, and/or the reference voltage line RL and the driving voltage line PL, may be shared by neighboring pixels.

The pixel circuit PC is not limited to the number of the thin-film transistors and the storage capacitors and the circuit design described with reference to FIGS. 2A and 2B, and the number of the thin-film transistors and the storage capacitors and the circuit design may be variously changed.

Figure 3:
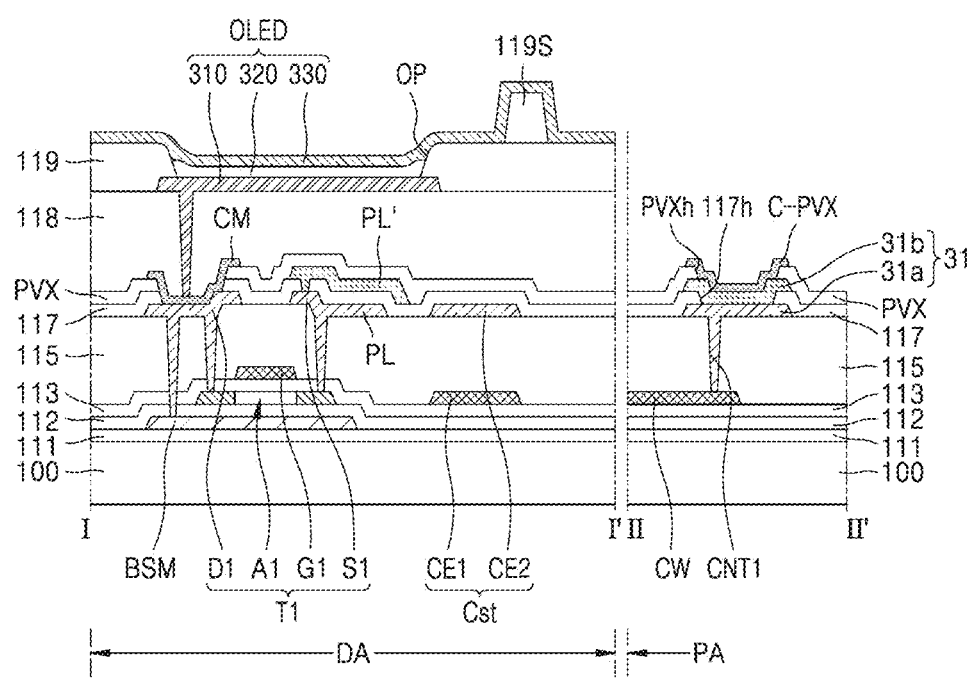
FIG. 3 is a schematic cross-sectional view of a display device according to an exemplary embodiment.

FIG. 3 is a cross-sectional view of a portion of a display device according to an exemplary embodiment, taken along line I-I' in FIG. 1A and line II-II' in FIG. 1C.

Referring to FIG. 3, the display device according to an exemplary embodiment includes the pad 31 in the peripheral area PA. An edge (or side surface) of the pad 31 may be covered by a first insulating layer PVX, and a central portion of the pad 31 may be covered by the second conductive layer C-PVX.

The second conductive layer C-PVX may include a metal having a lower oxidation degree or a metal having higher corrosion resistance than a material forming the pad 31. The pad 31 may include a multilayer structure. In this case, the second conductive layer C-PVX may include a metal having a lower oxidation degree or a metal having higher corrosion resistance than an uppermost layer of the pad 31. In exemplary embodiments, the pad 31 or the uppermost layer of the pad 31 may include copper (Cu) and the second conductive layer C-PVX may include titanium (Ti). In an exemplary embodiment, the pad 31 may include a first pad layer 31a and a second pad layer 31b, and each of the first pad layer 31a and the second pad layer 31b may include a multilayer structure.

FIG. 3 illustrates that the driving thin-film transistor T1 and the storage capacitor Cst of the pixel circuit PC of each pixel P described with reference to FIGS. 2A and 2B are included in the display area DA. For convenience of explanation, a structure arranged in FIG. 3 will now be described according to a stacking order.

The lower substrate 100 may include, for example, a glass material, a ceramic material, a metal material, or a polymer resin material such as polyimide. The lower substrate 100 may have a single-layer structure or a multilayer structure, and may further include an inorganic layer in the case of a multilayer structure.

A first buffer layer 111 may be arranged on the lower substrate 100. The first buffer layer 111 may prevent or reduce penetration of impurities from the lower substrate 100 into a semiconductor layer A1. The first buffer layer 111 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The bias electrode BSM may be arranged on the first buffer layer 111 to correspond to the driving thin-film transistor T1. For example, the bias electrode BSM may overlap the semiconductor layer A1 of the driving thin-film transistor T1. A voltage may be applied to the bias electrode BSM. For example, the bias electrode BSM may be connected to the source electrode S3 (see FIG. 2B) of the sensing thin-film transistor T3 (see FIG. 2B) to be applied with a voltage of the source electrode S3. In addition, the bias electrode BSM may prevent external light from reaching the semiconductor layer A1. Accordingly, characteristics of the driving thin-film transistor T1 may be stabilized. In exemplary embodiments, the bias electrode BSM may be omitted.

A second buffer layer 112 may cover the bias electrode BSM and may be formed on an entire top surface of the lower substrate 100. The second buffer layer 112 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The semiconductor layer A1 may be arranged on the second buffer layer 112. The semiconductor layer A1 may include, for example, amorphous silicon or polysilicon. In an exemplary embodiment, the semiconductor layer A1 may include an oxide of at least one or more materials selected from a group including indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In exemplary embodiments, the semiconductor layer A1 may include a zinc-oxide-based material and may include, for example, Zn oxide, In—Zn oxide, or Ga—In—Zn oxide. In an exemplary embodiment, the semiconductor layer A1 may include, for example, an In—Ga—Zn—O (IGZO), In—Sn—Zn—O (ITZO), or In—Ga—Sn—Zn—O (IGTZO) semiconductor, which include a metal such as, for example, In, Ga, and tin (Sn) in ZnO. The semiconductor layer A1 may include a channel area, as well as a source area and a drain area arranged on both sides of the channel area. The semiconductor layer A1 may include a single layer or a multilayer.

The gate electrode G1 is arranged above the semiconductor layer A1 to at least partially overlap the semiconductor layer A1 with a gate insulating layer 113 between the semiconductor layer A1 and the gate electrode G1. The gate electrode G1 may include, for example, molybdenum (Mo), Al, Cu, or Ti, and may include a single layer or a multilayer. The first electrode CE1 of the storage capacitor Cst may be arranged on the same layer as the gate electrode G1. The first electrode CE1 may include the same material as the gate electrode G1.

The connection line CW may be arranged on the gate insulating layer 113 in the peripheral area PA. The connection line CW may extend to the display area DA and may be connected to lines arranged on different layers through a contact hole. In the peripheral area PA, the connection line CW may be connected to the pad 31 through the first contact hole CNT1 defined in a first interlayer insulating layer 115. The connection line CW may be arranged on the same layer as the gate electrode G1 of the driving thin-film transistor T1. For example, in an exemplary embodiment, both the connection line CW and the gate electrode G1 are disposed directly on and directly contact the gate insulating layer 113.

The gate insulating layer 113 may include an inorganic insulating material. The gate insulating layer 113 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The first interlayer insulating layer 115 may cover the gate electrode G1 and the first electrode CE1 of the storage capacitor Cst. The first interlayer insulating layer 115 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second electrode CE2 of the storage capacitor Cst, the source electrode S1, the drain electrode D1, and the driving voltage line PL may be arranged on the first interlayer insulating layer 115. In the peripheral area PA, the first pad layer 31a may be arranged on the first interlayer insulating layer 115. The first pad layer 31a may be arranged on the same layer as the second electrode CE2 of the storage capacitor Cst, the source electrode S1, the drain electrode D1, and the driving voltage line PL. For example, in an exemplary embodiment, each of the first pad layer 31a, the second electrode CE2 of the storage capacitor Cst, the source electrode S1, the drain electrode D1, and the driving voltage line PL are disposed directly on and directly contact the first interlayer insulating layer 115. The first pad layer 31a may be in contact with the connection line CW through the first contact hole CNT1.

The second electrode CE2 of the storage capacitor Cst, the source electrode S1, the drain electrode D1, the driving voltage line PL, and the first pad layer 31a may include a conductive material including, for example, Mo, Al, Cu, or Ti, and may include a single layer or a multilayer including the above-stated material. In an exemplary embodiment, the second electrode CE2 of the storage capacitor Cst, the source electrode S1, the drain electrode D1, the driving voltage line PL, and the first pad layer 31a may include a multilayer structure of Ti/Cu, the multilayer structure including a first layer including Ti and a second layer including Cu. The source electrode S1 and the drain electrode D1 may be connected to a source area or a drain area of the semiconductor layer A1 through a contact hole.

The second electrode CE2 of the storage capacitor Cst overlaps the first electrode CE1 with the first interlayer insulating layer 115 therebetween to form a capacitance. In this case, the first interlayer insulating layer 115 may perform a function of a dielectric layer of the storage capacitor Cst. A thickness of the first interlayer insulating layer 115 may be designed according to a value of the capacitance of the storage capacitor Cst.

A second interlayer insulating layer 117 may be arranged on the second electrode CE2 of the storage capacitor Cst, the source electrode S1 of the driving thin-film transistor T1, the drain electrode D1 of the driving thin-film transistor T1, and the driving voltage line DL. For example, as shown in FIG. 3, the second interlayer insulating layer 117 may contact and cover at least a portion of the drain electrode D1 of the driving thin-film transistor T1, may cover at least a portion of the gate electrode G1 of the driving thin-film transistor T1 (with the first interlayer insulating layer 115 interposed therebetween), may cover at least a portion of the semiconductor layer A1 of the driving thin-film transistor T1 (with the first interlayer insulating layer 115, the gate electrode G1, and the gate insulating layer 113 interposed therebetween), and may contact and cover at least a portion of the source electrode S1 of the driving thin-film transistor T1. Thus, the second insulating layer 117 may be referred to as covering the driving thin-film transistor T1. The second interlayer insulating layer 117 may include an inorganic insulating layer including, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A conductive layer PL', also referred to herein as a first conductive layer PL', may be arranged on the second interlayer insulating layer 117. The first conductive layer PL' may be in contact with the driving voltage line PL or the source electrode S1 of the driving thin-film transistor T1 below the first conductive layer PL' through a contact hole penetrating the second interlayer insulating layer 117. The first conductive layer PL' may be connected to the driving voltage line PL to function as a line transferring the driving voltage. Due to the inclusion of the first conductive layer PL', a voltage drop of the driving voltage may be prevented and a uniform driving voltage across the display device may be provided.

In the peripheral area PA, the second interlayer insulating layer 117 may include an opening hole 117*h* covering an edge (or side surface) of the first pad layer 31*a* and exposing a central portion of the first pad layer 31*a*. The second pad layer 31*b* may be provided to correspond to the opening hole 117*h* of the second interlayer insulating layer 117. The second pad layer 31*b* may be formed on the second interlayer insulating layer 117 and may be in contact with the first pad layer 31*a* through the opening hole 117*h* of the second interlayer insulating layer 117. The second pad layer 31*b* may be disposed on the same layer as the first conductive layer PL'. For example, in an exemplary embodiment, the second pad layer 31*b* and the first conductive layer PL' are disposed directly on and directly contact the second interlayer insulating layer 117. The second pad layer 31*b* may be formed of the same material as the first conductive layer PL' at the same time when the first conductive layer PL' is formed. Due to the formation of the second pad layer 31*b*, the electrical resistance of the pad 31 may be reduced.

An upper conductive layer spaced apart from the first conductive layer PL' may be further arranged above the second interlayer insulating layer 117. The upper conductive layer may be connected to conductive layers arranged above the first interlayer insulating layer 115. The first conductive layer PL' and the second pad layer 31*b* may include a conductive material including, for example, Mo, Al, Cu, or Ti, and may include a single layer or a multilayer including the above-stated material. In an exemplary embodiment, the first conductive layer PL' and the second pad layer 31*b* may have a multilayer structure of Ti/Cu, the multilayer including a first layer including Ti and a second layer including Cu.

The first conductive layer PL' and the upper conductive layer arranged on the second interlayer insulating layer 117 may be covered by the first insulating layer PVX.

The first insulating layer PVX may include an inorganic material. The first insulating layer PVX may include a single film or a multilayer film of, for example, $SiN_x$ and silicon oxide ($SiO_x$). The first insulating layer PVX may cover and protect a portion of conductive layers or lines arranged above the second interlayer insulating layer 117. A portion of the conductive layers and/or lines formed together in the same process as the first conductive layer PL' may be exposed in a portion of areas (for example, a portion of the peripheral area PA) of the lower substrate 100. The exposed portion of the conductive layers and/or the lines may be damaged by an etchant during patterning of a pixel electrode 310 to be described below, and since the first insulating layer PVX covers at least a portion of the conductive layers and/or lines, the lines may be prevented from being damaged in the patterning process of the pixel electrode 310.

In addition, a planarization layer 118 including an organic material may be arranged on the first insulating layer PVX. Referring to a comparative example, when the first insulating layer PVX is not included, the first conductive layer PL' may be oxidized or corroded by reacting with oxygen penetrated into the planarization layer 118. However, in exemplary embodiments, the inclusion of the first insulating layer PVX may prevent the first conductive layer PL' from being in direct contact with the planarization layer 118, thus preventing oxidization of the first conductive layer PL' and preventing changes in characteristics thereof caused by the oxidization.

The first insulating layer PVX may include an opening hole PVXh corresponding to the pad 31 of the peripheral area PA. For example, the first insulating layer PVX may include the opening hole PVXh covering the edge (or side surface) of the pad 31 and exposing the central portion of the pad 31. The second conductive layer C-PVX may be arranged to correspond to the opening hole PVXh of the first insulating layer PVX. For example, in an exemplary embodiment a side surface of the pad 31 may be covered by the first insulating layer PVX, and the central portion of the pad 31 may be covered by the second conductive layer C-PVX.

Since the pad 31 is to be electrically connected to an external device or the printed circuit board PCB (see FIG. 1) later, a portion of the first insulating layer PVX may be removed to expose the pad 31. In this case, the pad 31 may be damaged by an etchant used in a later process.

The second conductive layer C-PVX may be a layer provided to protect the pad 31 from being damaged. In addition, the second conductive layer C-PVX may be a medium that has conductivity to allow the pad 31 to be electrically connected to an external terminal. The second conductive layer C-PVX may be in direct contact with the second pad layer 31*b* through the opening hole PVXh of the first insulating layer PVX.

In an exemplary embodiment, the second conductive layer C-PVX may include a metal having a lower oxidation degree or a metal having higher corrosion resistance than a material forming the pad 31. In exemplary embodiments, the second conductive layer C-PVX may include Ti.

When the second conductive layer C-PVX includes an oxide having conductivity such as, for example, an indium tin oxide (ITO), an indium zinc oxide (IZO), a zinc oxide (ZnO), an indium oxide ($In_2O_3$), an indium gallium oxide (IGO), or an aluminum zinc oxide (AZO), since the materials have a pinhole formed therein, an etchant may flow into the pad 31 below the pinhole through the pinhole.

In an exemplary embodiment, the second conductive layer C-PVX may include a metal instead of a conductive oxide to reduce the influence of the pinhole. In addition, in an exemplary embodiment, the second conductive layer C-PVX includes a material having a lower oxidation degree than a material included in the pad, for example, a material which does not change its properties even when exposed to the outside.

In the display area DA, the planarization layer 118 may be arranged on the first insulating layer PVX, and the organic light-emitting diode OLED may be arranged on the planarization layer 118.

The planarization layer 118 may include a single layer or a multilayer including a film of an organic material, and provides a flat upper surface. The planarization layer 118 may include, for example, benzocyclobutene (BCB), polyimide, hexamethyldisiloxane (HDMSO), a general commercial polymer such as poly(methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, and a mixture thereof.

In the lower substrate 100 in the display area DA, the organic light-emitting diode OLED may be arranged on the planarization layer 118. The organic light-emitting diode OLED includes the pixel electrode 310, an intermediate layer 320 including an organic emission layer, and an opposite electrode 330.

The pixel electrode 310 may include a (semi)transparent electrode or a reflective electrode. In exemplary embodiments, the pixel electrode 310 may include a reflective layer including, for example, silver (Ag), magnesium (Mg), Al, platinum (Pt), palladium (Pd), gold (Au), nickel (Ni), neodymium (Nd), iridium (Jr), chromium (Cr), or a compound thereof, and a transparent or semi-transparent electrode layer formed on the reflective layer. The transparent or semi-transparent electrode layer may include at least one selected from a group including an indium tin oxide (ITO), an indium zinc oxide (IZO), a zinc oxide (ZnO), an indium oxide ($In_2O_3$), an indium gallium oxide (IGO), and an aluminum oxide (AZO). In exemplary embodiments, the pixel electrode 310 may include ITO/Ag/ITO.

A pixel defining film 119 may be arranged on the planarization layer 118. The pixel defining film 119 may define an emission area of a pixel P by having an opening corresponding to each sub-pixel in the display area DA, for example, an opening OP exposing at least a central portion of the pixel electrode 310. In addition, the pixel defining film 119 may prevent an arc from being generated at an edge (or side surface) of the pixel electrode 310 by increasing a distance between the edge (or side surface) of the pixel electrode 310 and the opposite electrode 330 above the pixel electrode 310.

The pixel defining film 119 may be formed of one or more organic insulating materials selected from a group including, for example, polyimide, polyamide, an acrylic resin, BCB, and a phenol resin by, for example, a spin coating method.

The intermediate layer 320 of the organic light-emitting diode OLED may include the organic emission layer. The organic emission layer may include an organic material including a fluorescent or phosphorescent material emitting red, green, blue, or white light. The organic emission layer may include a low-molecular-weight material or a polymer material and functional layers such as, for example, a hole transport layer (HTL), a hole injection layer (HIL), an electron transport layer (ETL), or an electron injection layer (EIL), which may be selectively arranged below or above the organic emission layer. The intermediate layer 320 may be arranged to correspond to each of a plurality of pixel electrodes 310. However, the intermediate layer 320 is not limited to thereto. For example, various modifications may be made, such as the intermediate layer 320 including a single-body layer over the plurality of pixel electrodes 310.

The opposite electrode 330 may include a transparent electrode or a reflective electrode. In exemplary embodiments, the opposite electrode 330 may include a transparent or a semi-transparent electrode, and may include a metal thin film having a small work function and including, for example, lithium (Li), calcium (Ca), lithium fluoride (LiF)/Ca, LiF/Al, Al, Ag, Mg, or a compound thereof. In addition, a transparent conductive oxide (TCO) film such as, for example, ITO, IZO, ZnO, or $In_2O_3$ may be further arranged on the metal thin film. The opposite electrode 330 may be arranged over the display area DA and the peripheral area PA, and may be arranged on the intermediate layer 320 and the pixel defining film 119. The opposite electrode 330 may be formed as a single body in a plurality of organic light-emitting diodes OLED to correspond to the plurality of pixel electrodes 310.

A spacer 1195 may be further included on the pixel defining film 119. The spacer 1195 may prevent damage caused by a mask. The spacer 1195 and the pixel defining film 119 may be formed as a single body. For example, the spacer 1195 and the pixel defining film 119 may be simultaneously formed in the same process using a halftone mask process.

The pixel electrode 310 may be connected to the drain electrode D1 of the driving thin-film transistor T1 through a connection electrode CM. The connection electrode CM may be connected to the drain electrode D1 of the driving thin-film transistor T1 through a contact hole penetrating the second interlayer insulating layer 117 and the first insulating layer PVX, and the pixel electrode 310 may be connected to the connection electrode CM through a contact hole penetrating the planarization layer 118. The connection electrode CM may prevent the drain electrode D1 of the driving thin-film transistor T1 from being damaged. The connection electrode CM may be formed of the same material as the connection electrode C-PVX at the same time when the second conductive layer C-PVX is formed.

Figure 4A:
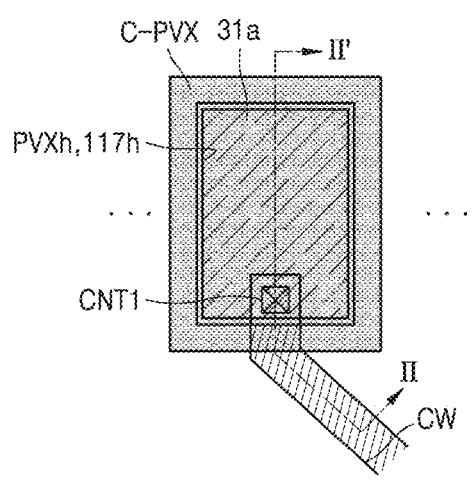
FIG. 4A is a schematic plan view of a pad of a display device according to an exemplary embodiment.
Figure 4B:
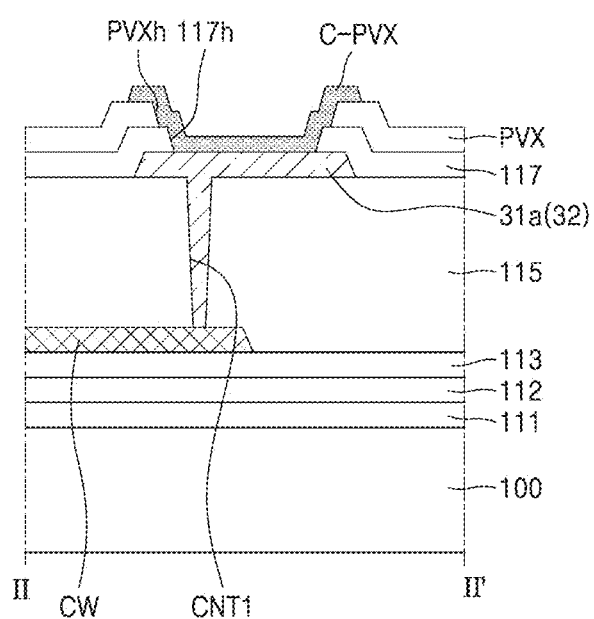
FIG. 4B is a schematic cross-sectional view taken along line II-II' of FIG. 4A according to an exemplary embodiment.

FIG. 4A is a schematic plan view of a pad 32 of a display device according to an exemplary embodiment. FIG. 4B is a cross-sectional view of the pad taken along line II-II' of FIG. 4A according to an exemplary embodiment. In FIGS. 4A and 4B, the same reference numerals as those in FIG. 3 refer to the same members. Accordingly, for convenience of explanation, a redundant description thereof will be omitted.

Referring to FIGS. 4A and 4B, a display device according to an exemplary embodiment may include the pad 32 in the peripheral area PA. An edge (or side surface) of the pad 32 may be covered by the second interlayer insulating layer 117 and/or the first insulating layer PVX, and a central portion of the pad 32 may be covered by the second conductive layer C-PVX.

In an exemplary embodiment, the pad 32 may only include the first pad layer 31a. The first pad layer 31a may be connected to the connection line CW through the first contact hole CNT1 penetrating the first interlayer insulating layer 115. An edge (or side surface) of the first pad layer 31a may be covered by the second interlayer insulating layer 117 and/or the first insulating layer PVX, and a central portion of the first pad layer 31a may be covered by the second conductive layer C-PVX. The second conductive layer C-PVX may be arranged inside the opening hole PVXh of the first insulating layer PVX and the opening hole 117h of the second interlayer insulating layer 117, and may be in direct contact with an upper surface of the first pad layer 31a. Further, a portion of the second conductive layer C-PVX may extend to an upper surface of the first insulating layer PVX.

The first pad layer 31a may include a metal having excellent electrical conductivity. For example, the first pad layer 31a may include Cu. In exemplary embodiments, the first pad layer 31a may include a multilayer of Ti/Cu, the multilayer including a first layer including Ti and a second layer on the first layer and including Cu. The second layer of the first pad layer 31a may include a material having a high oxidation degree and may be easily damaged by an etchant during certain processes.

The second conductive layer C-PVX may include a metal having a lower oxidization degree or a metal having higher corrosion resistance than a material of the pad 32, for example, the first pad layer 31a. In exemplary embodiments, the second conductive layer C-PVX may include Ti.

In an exemplary embodiment, since the edge (or side surface) of the pad 32 is covered by the first insulating layer PVX and/or the second interlayer insulating layer 117, and the central portion of the pad 32 is covered by the second conductive layer C-PVX, damage to the pad 32 by an etchant used during certain processes may be reduced and the pad 32 may be prevented from being oxidized.

Figure 5A:
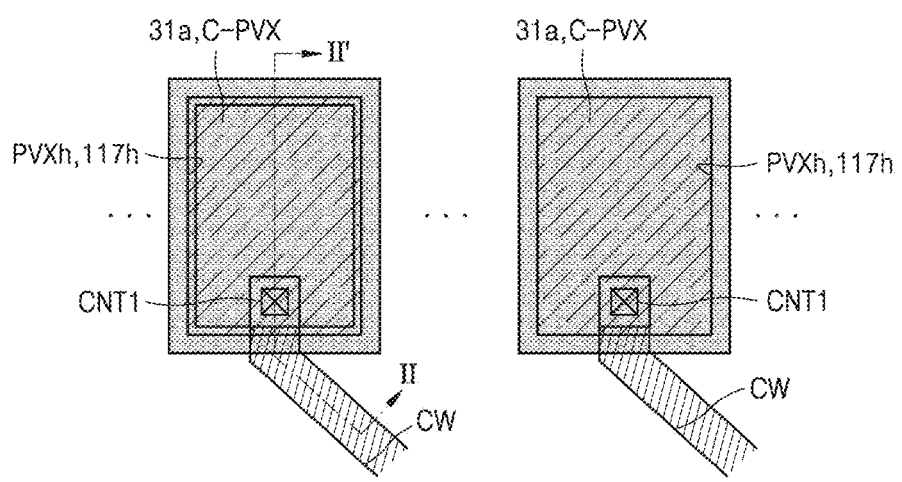
FIG. 5A is a schematic cross-sectional view of a pad of a display device according to an exemplary embodiment.
Figure 5B:
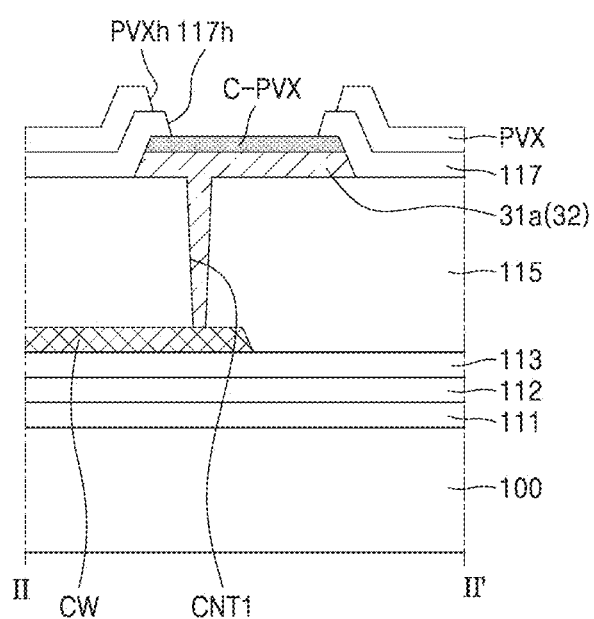
FIG. 5B is a schematic cross-sectional view taken along line II-II' of FIG. 5A according to an exemplary embodiment.

FIG. 5A is a schematic plan view of the pad 32 of a display device according to an exemplary embodiment. FIG. 5B is a cross-sectional view of the pad taken along line II-II' of FIG. 5A according to an exemplary embodiment. In FIGS. 5A and 5B, the same reference numerals as those in FIG. 3 refer to the same members. Accordingly, for convenience of explanation, a redundant description thereof will be omitted.

Referring to FIGS. 5A and 5B, a display device according to an exemplary embodiment may include the pad 32 in the peripheral area PA. The edge (or side surface) of the pad 32 may be covered by the second interlayer insulating layer 117 and/or the first insulating layer PVX, and the central portion of the pad 32 may be covered by the second conductive layer C-PVX.

In an exemplary embodiment, the pad 32 may only include the first pad layer 31a. The first pad layer 31a may be connected to the connection line CW through the first contact hole CNT1 penetrating the first interlayer insulating layer 115. The edge (or side surface) of the first pad layer 31a may be covered by the second interlayer insulating layer 117 and/or the first insulating layer PVX, and the central portion of the first pad layer 31a may be covered by the second conductive layer C-PVX.

In an exemplary embodiment, the second conductive layer C-PVX may be formed before the second interlayer insulating layer 117 is formed. For example, after a conductive layer forming the first pad layer 31a is deposited, a conductive layer forming the second conductive layer C-PVX is deposited on the conductive layer forming the first pad layer 31a. Then, the conductive layers are simultaneously etched to form the first pad layer 31a and the second conductive layer C-PVX.

Next, the second interlayer insulating layer 117 and the first insulating layer PVX may be formed, and the opening holes 117h and PVXh exposing the central portion of the second conductive layer C-PVX may be formed.

Accordingly, the second conductive layer C-PVX may be arranged inside the opening hole PVXh of the first insulating layer PVX and the opening hole 117h of the second interlayer insulating layer 117, and may be in direct contact with the upper surface of the first pad layer 31a. In addition, a side surface of the second conductive layer C-PVX may be covered by the second interlayer insulating layer 117 and/or the first insulating layer PVX. A side surface of the pad 32 may also be covered by the second interlayer insulating layer 117 and/or the first insulating layer PVX.

The first pad layer 31a may include a metal having excellent electrical conductivity. For example, the first pad layer 31a may include Cu. In exemplary embodiments, the first pad layer 31a may include a multilayer of Ti/Cu, the multilayer including a first layer including Ti and a second layer on the first layer and including Cu. The second layer of the first pad layer 31a may include a material having a high oxidation degree and may be easily damaged by an etchant during certain processes.

The second conductive layer C-PVX may include a metal having a lower oxidization degree or a metal having higher corrosion resistance than a material of the pad 32, for example, the first pad layer 31a. In exemplary embodiments, the second conductive layer C-PVX may include Ti.

In an exemplary embodiment, since the side surface of the pad 32 is covered by the first insulating layer PVX and/or the second interlayer insulating layer 117, and the central portion of the pad 32 is covered by the second conductive layer C-PVX, damage to the pad 32 by an etchant during certain processes may be reduced and the pad 32 may be prevented from being oxidized.

Figure 6:
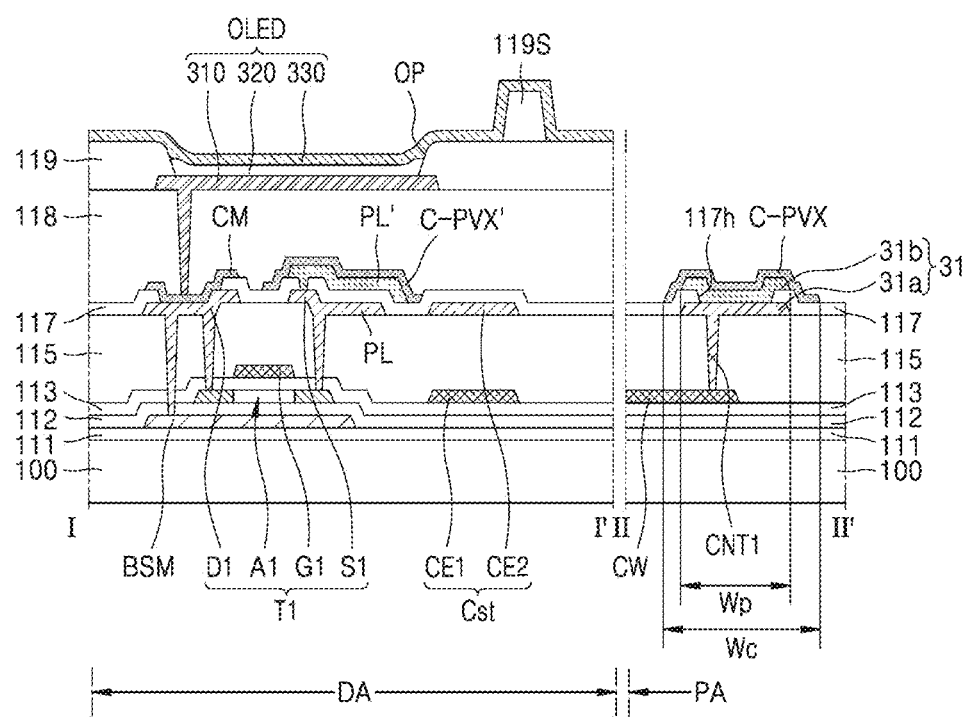
FIG. 6 is a schematic cross-sectional view of a display device according to an exemplary embodiment.

FIG. 6 is a cross-sectional view of a portion of a display device according to an exemplary embodiment, which particularly illustrates the periphery of the pad 31. In FIG. 6, the same reference numerals as those in FIG. 3 refer to the same members. Thus, for convenience of explanation, a redundant description thereof will be omitted.

Referring to FIG. 6, a display device according to an exemplary embodiment may include the pad 31 in the peripheral area PA, and the edge (or side surface) of the pad 31 and the central portion of the pad 31 may be covered by the second conductive layer C-PVX.

In an exemplary embodiment, the second conductive layer C-PVX may cover the upper surface and the side surface of the pad 31. A width We of the second conductive layer C-PVX may be greater than a width Wp of the pad 31 to cover the side surface of the pad 31. In an exemplary embodiment as illustrated in FIG. 6, since the second conductive layer C-PVX covers and protects the side surface of the pad 31, the first insulating layer PVX is not included.

The pad 31 may include the first pad layer 31a and the second pad layer 31b, and the second conductive layer C-PVX may cover a side surface of the second pad layer 31b. The side surface of the second pad layer 31b may be covered by the second interlayer insulating layer 117.

In the display area DA, an additional second conductive layer C-PVX' may be arranged on the first conductive layer PL' on the second interlayer insulating layer 117. A width of the additional second conductive layer C-PVX' may be greater than a width of the first conductive layer PL'. The additional second conductive layer C-PVX' may cover an upper surface and a side surface of the first conductive layer PL' such that the first conductive layer PL' is not in direct contact with the planarization layer 118. Accordingly, damage to and oxidation of the first conductive layer PL' may be prevented in the processes.

The first conductive layer PL', the first pad layer 31a, and the second pad layer 31b may include a metal having excellent electrical conductivity. For example, the first conductive layer PL', the first pad layer 31a, and the second pad layer 31b may include Cu. In exemplary embodiments, the first conductive layer PL', the first pad layer 31a, and the second pad layer 31b may include a multilayer of Ti/Cu, the multilayer including a first layer including Ti and a second layer on the first layer and including Cu.

The second conductive layer C-PVX may include a metal having a lower oxidation degree or a metal having higher corrosion resistance than a material included in an upper portion of the pad 31. In exemplary embodiments, the second conductive layer C-PVX may include Ti.

In exemplary embodiments, because the side surface and the central portion of the pad 31 are covered by the second conductive layer C-PVX, damage to the pad 31 by an etchant during certain processes may be reduced, and the pad 31 may be prevented from being oxidized.

Figure 7:
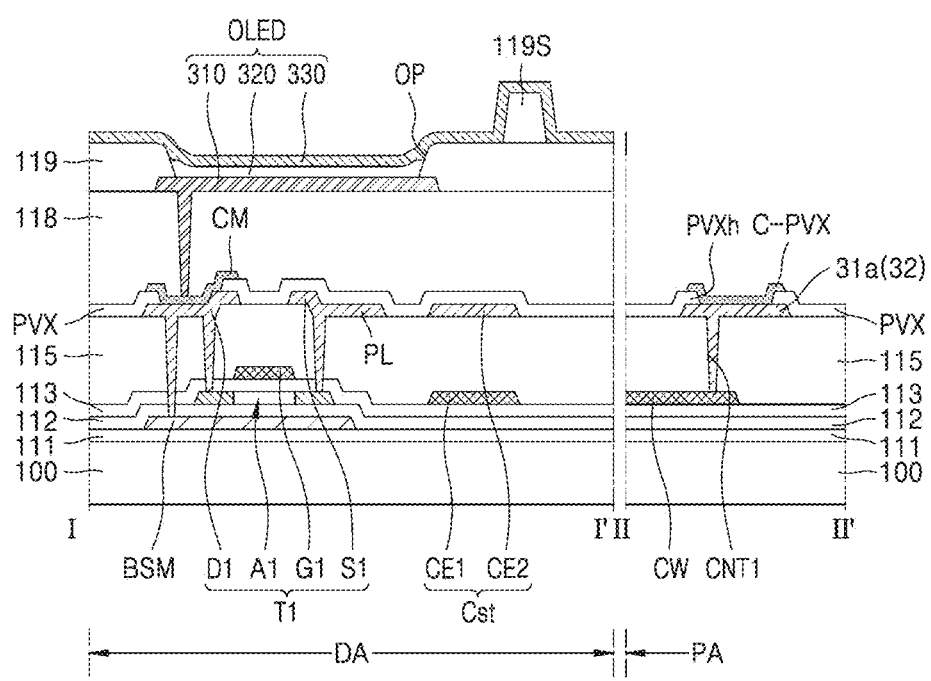
FIG. 7 is a schematic cross-sectional view of a display device according to an exemplary embodiment.

FIG. 7 is a cross-sectional view of a portion of a display device according to an exemplary embodiment, which particularly illustrates the periphery of the pad 32. In FIG. 7, the same reference numerals as those in FIG. 3 refer to the same members. Thus, for convenience of explanation, a redundant description thereof will be omitted In an exemplary embodiment according to FIG. 7, the first conductive layer PL' (see FIG. 3) is not arranged in the display area DA. Accordingly, the second interlayer insulating layer 117 (see FIG. 3) between the first conductive layer PL' and the driving voltage line PL may be omitted.

Referring to FIG. 7, a display device according to an exemplary embodiment may include the pad 32 in the peripheral area PA, the edge (or side surface) of the pad 32 may be covered by the first insulating layer PVX, and the central portion of the pad 32 may be covered by the second conductive layer C-PVX.

In an exemplary embodiment according to FIG. 7, the pad 32 may only include the first pad layer 31a. The first pad layer 31a may be connected to the connection line CW through the first contact hole CNT1 penetrating the first interlayer insulating layer 115. The edge (or side surface) of the first pad layer 31a may be covered by the first insulating layer PVX, and the central portion of the first pad layer 31a may be covered by the second conductive layer C-PVX. The second conductive layer C-PVX may be arranged inside the opening hole PVXh of the first insulating layer PVX to be in direct contact with the upper surface of the first pad layer 31a, and a portion of the second conductive layer C-PVX may extend to an upper surface of the first insulating layer PVX.

The first pad layer 31a may include a metal having excellent electrical conductivity. For example, the first pad layer 31a may include Cu. In exemplary embodiments, the first pad layer 31a may include a multilayer of Ti/Cu, the multilayer including a first layer including Ti and a second layer on the first layer and including Cu. The first pad layer 31a may include a material having a high oxidation degree and may be easily damaged by an etchant during certain processes.

The second conductive layer C-PVX may include a metal having a lower oxidization degree or a metal having higher corrosion resistance than a material of the pad 32, for example, the first pad layer 31a. In exemplary embodiments, the second conductive layer C-PVX may include Ti.

In an exemplary embodiment according to FIG. 7, since the edge (or side surface) of the pad 32 is covered by the first insulating layer PVX and/or the second interlayer insulating layer 117, and the central portion of the pad 32 is covered by the second conductive layer C-PVX, damage to the pad 32 by an etchant during certain processes may be reduced and the pad 32 may be prevented from being oxidized.

Figure 8:
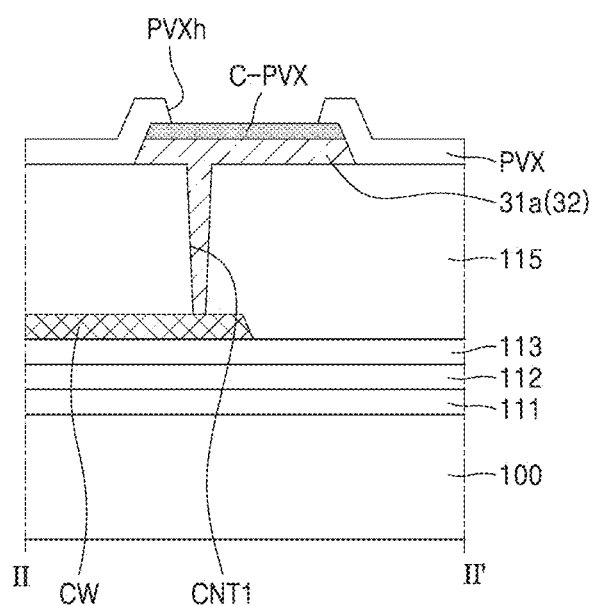
FIG. 8 is a schematic cross-sectional view of a display device according to an exemplary embodiment.

FIG. 8 is a cross-sectional view of a portion of a display device according to an exemplary embodiment, which particularly illustrates the periphery of the pad 32. In FIG. 8, the same reference numerals as those in FIG. 7 refer to the same members. Thus, for convenience of explanation, a redundant description thereof will be omitted.

Referring to FIG. 8, the second conductive layer C-PVX may be arranged on the upper surface of the pad 32, and the first insulating layer PVX may be arranged to cover the side surfaces of the second conductive layer C-PVX and the pad 32. For example, the first insulating layer PVX may be arranged on the second conductive layer C-PVX and may include the opening hole PVXh exposing the upper surface of the second conductive layer C-PVX.

In an exemplary embodiment according to FIG. 8, since the upper surface of the pad 32 is covered by the second conductive layer C-PVX and the side surface of the pad 32 is covered by the first insulating layer PVX, the pad 32 may be prevented from being damaged in certain processes and may be prevented from being oxidized.

Figure 9:
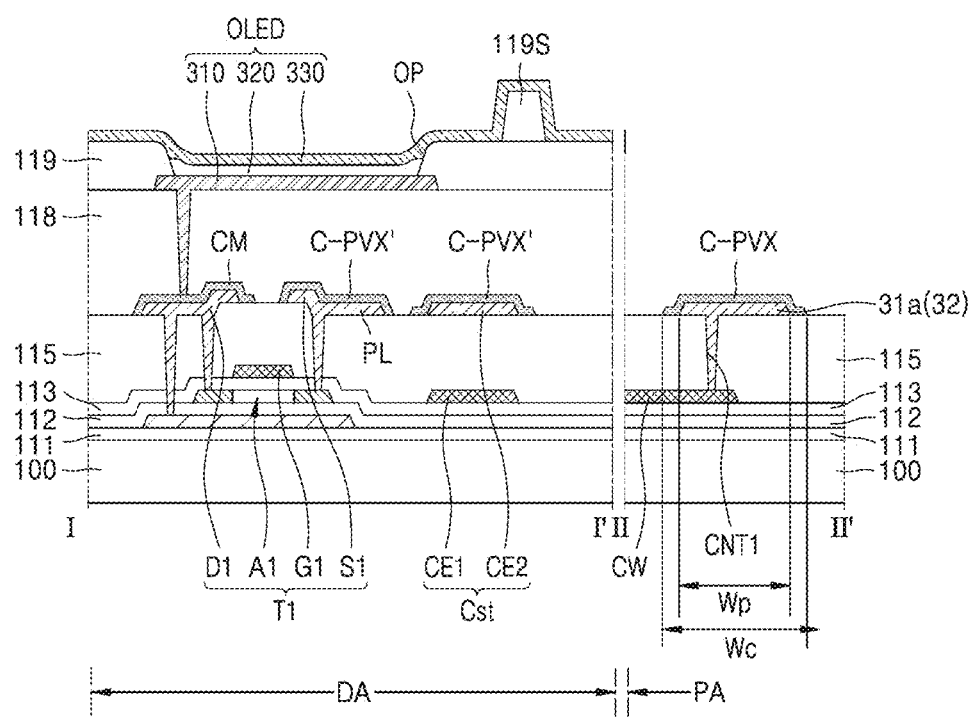
FIG. 9 is a schematic cross-sectional view of a display device according to an exemplary embodiment.

FIG. 9 is a cross-sectional view of a portion of a display device according to an exemplary embodiment. In FIG. 9, the same reference numerals as those in FIG. 7 refer to the same members. Thus, for convenience of explanation, a redundant description thereof will be omitted.

Referring to FIG. 9, the second conductive layer C-PVX may be arranged to cover the upper surface and the side surface of the pad 32. For example, the width Wc of the second conductive layer C-PVX may be greater than the width Wp of the pad 32.

In addition, the drain electrode D1 arranged in the display area DA may be covered by the connection electrode CM, and upper surfaces and side surfaces of the source electrode S1, the driving voltage line PL, and the second electrode CE2 may be covered by the additional second conductive layer C-PVX'. Accordingly, since the drain electrode D1, the source electrode S1, the driving voltage line PL, and the second electrode CE2 are not in direct contact with the planarization layer 118, oxidation may be prevented.

In an exemplary embodiment according to FIG. 9, since the upper surface and the side surface of the pad 32 are covered by the second conductive layer C-PVX, the pad 32 may be prevented from being damaged during certain processes and may be prevented from being oxidized.

Figure 10:
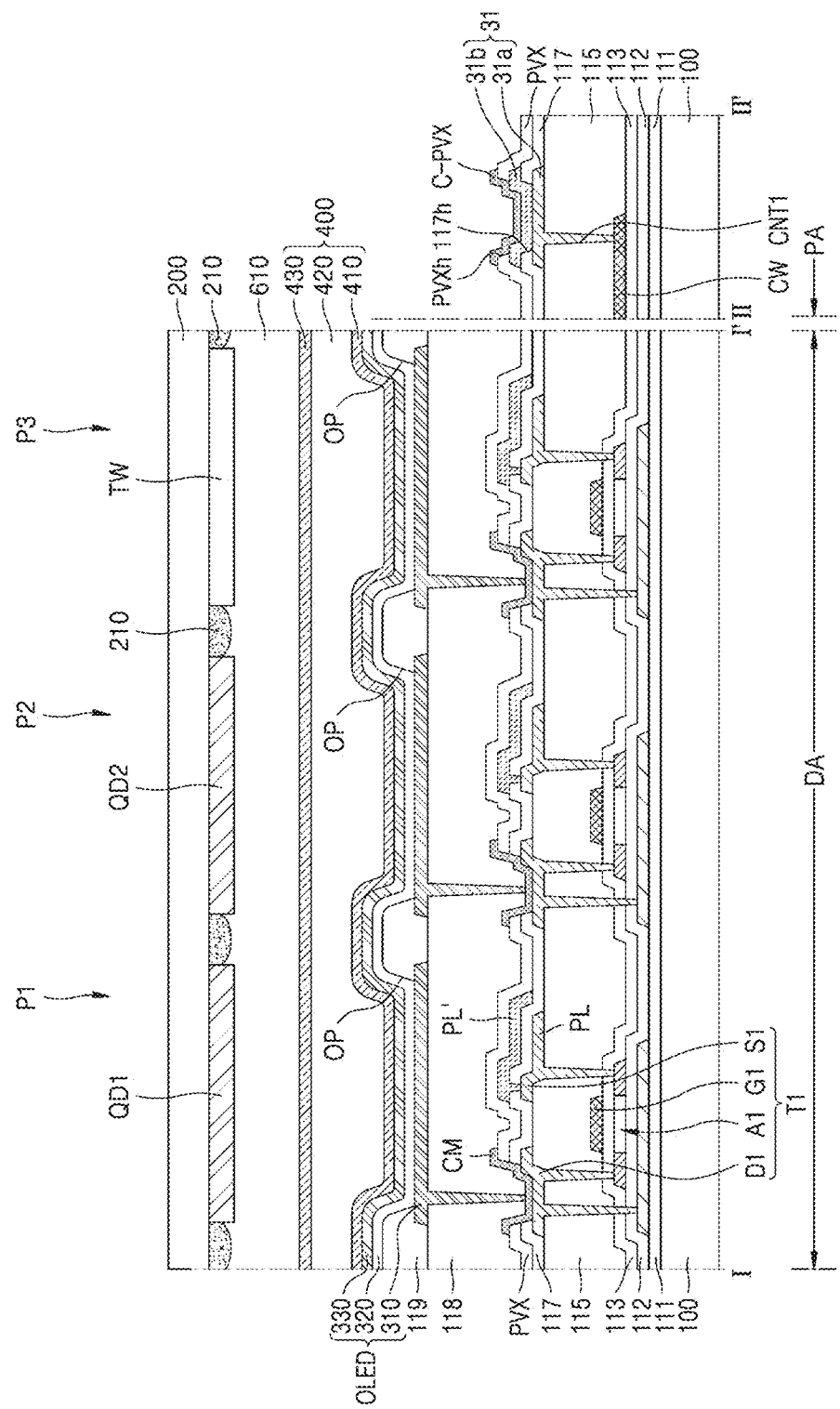
FIG. 10 is a schematic cross-sectional view of a display device according to an exemplary embodiment.

FIG. 10 is a schematic cross-sectional view of a display device according to an exemplary embodiment. In FIG. 10, the same reference numerals as those in FIG. 3 refer to the same members. Accordingly, for convenience of explanation, a redundant description thereof will be omitted.

A display device according to an exemplary embodiment includes a plurality of pixels P1, P2, and P3 arranged in the display area DA, the thin-film encapsulation layer 400 covering the plurality of pixels P1, P2, and P3, and the upper substrate 200 arranged on the thin-film encapsulation layer 400 and including first and second color converting layers QD1 and QD2 and a light blocking pattern 210.

The intermediate layer 320 of the organic light-emitting diode OLED arranged in each of the pixels P1, P2, and P3 may be commonly provided. Accordingly, the organic light-emitting diode OLED included in each of the pixels P1, P2, and P3 may emit the same color of light. For example, the intermediate layer 320 may include an organic emission layer including a fluorescent or phosphorescent material emitting blue light. The functional layers such as, for example, the HTL, HIL, ETL, or EIL may be selectively arranged below or above the organic emission layer.

Since the organic light-emitting diode OLED may be easily damaged by external moisture or oxygen, the organic light-emitting diode OLED may be covered and protected by the thin-film encapsulation layer 400. The thin-film encapsulation layer 400 may cover the display area DA and may extend to the outside of the display area DA. The thin-film encapsulation layer 400 includes at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include, for example, silicon oxide, silicon nitride, and/or silicon oxynitride. According to exemplary embodiments, other layers such as a capping layer may be provided between the first inorganic encapsulation layer 410 and the opposite electrode 330. In an exemplary embodiment, since the first inorganic encapsulation layer 410 is formed along an underlying structure, an upper surface of the first inorganic encapsulation layer 410 is not substantially flat. The organic encapsulation layer 420 may cover the first inorganic encapsulation layer 410, and unlike the first inorganic encapsulation layer 410, an upper surface of the organic encapsulation layer 420 may be formed substantially flat. For example, the organic encapsulation layer 420 may have a substantially flat upper surface in a portion thereof corresponding to the display area DA. The organic encapsulation layer 420 may include one or more materials selected from a group including, for example, polyethylene terephthalate PET, polyethylene naphthalate, polycarbonate, polyimide, polyethylene sulfonate, polyoxymethylene, polyarylate, and HMDSO. The second inorganic encapsulation layer 430 may cover the organic encapsulation layer 420 and may include, for example, silicon oxide, silicon nitride, and/or silicon oxynitride.

According to the multilayer structure, even when cracks occur in the thin-film encapsulation layer 400, the thin-film encapsulation layer 400 may prevent the cracks from connecting between the first inorganic encapsulation layer 410 and the organic encapsulation layer 420, or between the organic encapsulation layer 420 and the second inorganic encapsulation layer 430. Accordingly, the formation of a path through which external moisture or oxygen penetrates into the display area DA may be prevented or reduced.

The upper substrate 200 arranged to face the lower substrate 100 may be arranged above the thin-film encapsulation layer 400. The first and second color converting layers QD1 and QD2, a transmission window TW, and the light blocking pattern 210 may be arranged on the upper substrate 200.

The first and second color converting layers QD1 and QD2 may be layers that sharpen the color of light emitted from the organic light-emitting diode OLED or convert the color into another color. The first and second color converting layers QD1 and QD2 may include quantum dots and may include quantum converting layers. The quantum dots may be semiconductor particles with a diameter of only about 2 nm to about 10 nm and particles having unusual electrical and optical properties. When the quantum dots are exposed to light, the quantum dots may emit light at a particular frequency depending on a particle size and a type of material. For example, the quantum dots may emit red, green, and blue light when receiving light, depending on the size of the particles and/or the type of material.

A core of the quantum dots may be selected from, for example, a Group II-VI compound, a Group III-V compound, a Group IV-VI compound, a Group IV element, a Group IV compound, and a combination thereof.

The Group II-VI compound may be selected from a group including, for example, a binary compound, a ternary compound, and a quaternary compound, the binary compound being selected from a group including CdSe, CdTe, ZnS, ZnSe, ZnTe, ZnO, HgS, HgSe, HgTe, MgSe, MgS, and a mixture thereof, the ternary compound being selected from a group including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, the quaternary compound being selected from a group including HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compounds may be selected from a group including, for example, a binary compound, a ternary compound, and a quaternary compound, the binary compound being selected from a group including GaN, GaP, GaAs, GaSb, AN, AlP, AlAs, AlSb, InN, InP, InAs, InSb, and a mixture thereof, the ternary compound being selected from a group including GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof, the quaternary compound being selected from a group including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compounds may be selected from a group including, for example, a binary compound, a ternary compound, and a quaternary compound, the binary compound being selected from a group including SnS, SnSe, SnTe, PbS, PbSe, PbTe, and a mixture thereof, the ternary compound being selected from a group including SnSeS, SnSeTe, SnSTe, PbSeS, PbSeTe, PbSTe, SnPbS, SnPbSe, SnPbTe, and a mixture thereof, the quaternary compound being selected from a group including SnPbSSe, SnPbSeTe, SnPbSTe, and a mixture thereof. The Group IV element may be selected from a group including, for example Si, Ge, and a mixture thereof. The Group IV compound may be a binary compound selected from a group including, for example, SiC, SiGe, and a mixture thereof.

The binary compound, the ternary compound, and the quaternary compound may be present in the particles at a uniform concentration, or may be present in the same particle by being partially divided into different concentrations. In addition, one quantum dot may have a core/shell structure surrounding another quantum dot. An interface between the core and the shell may have a concentration gradient in which a concentration of elements in the shell decreases toward the center of the interface.

In exemplary embodiments, the quantum dot may have a core-shell structure including a core including the nanocrystal and a shell surrounding the core. The shell of the quantum dot may function as a protective layer preventing chemical modification of the core to maintain semiconductor characteristics and/or may function as a charging layer for imparting electrophoretic characteristics to the quantum dot. The shell may include a single layer or a multilayer. An interface between the core and the shell may have a concentration gradient in which a concentration of elements in the shell decreases toward the center of the interface. Examples of the shell of the quantum dot may include an oxide of a metal or a nonmetal, a semiconductor compound, or a combination thereof.

For example, the oxide of the metal or the nonmetal may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$, or a ternary compound such as $MgAl_2O_4$, $CoFe_2O_4$, $NiFe_2O_4$, or $CoMn_2O_4$. However, the present disclosure is not limited thereto.

In addition, the semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb. However, the present disclosure is not limited thereto.

In an exemplary embodiment, the quantum dot may have a full width of half maximum (FWHM) of an emission wavelength spectrum of about 45 nm or less. In an exemplary embodiment, the quantum dot may have a FWHM of an emission wavelength spectrum of about 40 nm or less. In an exemplary embodiment, the quantum dot may have a FWHM of an emission wavelength spectrum of about 30 nm or less. Color purity and color reproducibility may be improved in the above ranges. In addition, since light emitted through the quantum dot is emitted in all directions, a viewing angle of light may be improved.

In addition, a form of the quantum dot may be a generally used form that is not particularly limited. More particularly, in exemplary embodiments, the form of the quantum dot may include, for example, a sphere shape, a pyramid shape, a multi-arm shape, or cubic nanoparticles, nanotubes, nanowires, nanofibers, or nanoplatelets.

The first and second color converting layers QD1 and QD2 may be arranged to correspond to at least a portion of an emission area defined by the opening OP of the pixel defining film 119. For example, the first color converting layer QD1 may be arranged to correspond to an emission area of the first pixel P1, and the second color converting layer QD2 may be arranged to correspond to an emission area of the second pixel P2. In an exemplary embodiment, the first and second color converting layers QD1 and QD2 do not correspond to an emission area of the third pixel P3, and the transmission window TW may be arranged in the emission area of the third pixel P3. The transmission window TW may include an organic material that may emit light without converting a wavelength of light emitted from the organic light-emitting diode OLED of the third pixel P3. However, the present disclosure is not limited thereto. A color converting layer may be arranged in the emission area of the third pixel P3.

Scattering particles may be distributed in the first and second color converting layers QD1 and QD2 and the transmission window TW. Accordingly, color spreadability may be uniform.

The light blocking pattern 210 may be arranged between the first and second color converting layers QD1 and QD2 and the transmission window TW. The light blocking pattern 210 may be, for example, a black matrix and a member improving color sharpness and contrast. The light blocking pattern 210 may be arranged between the emission areas of each of the pixels P1, P2, and P3. Since the light blocking pattern 210 may be provided as a black matrix that absorbs visible light, color mixing of light emitted from emission areas of neighboring pixels may be prevented and visibility and contrast may be improved.

In exemplary embodiments, all of the plurality of the organic light-emitting diodes OLED may emit blue light. In this case, the first color converting layer QD1 may include a quantum dot from which red light is emitted, and the second color converting layer QD2 may include a quantum dot from which green light is emitted. Accordingly, light exiting to the outside of a display device may be red, green, and blue, and combinations of the colors may enable various color expressions.

A filler 610 may be further arranged between the lower substrate 100 and the upper substrate 200. The filler 610 may act as a buffer against external pressure. The filler 610 may include an organic material such as, for example, methyl silicone, phenyl silicone, and polyimide. However, the filler 610 is not limited thereto. For example, according to exemplary embodiments, the filler 610 may include a urethane resin, an epoxy resin, or an acrylic resin, which are an organic sealant, or silicon which is an inorganic sealant.

According to exemplary embodiments, the pad 31 and related layers as shown in the peripheral area PA in the cross-sectional view of FIG. 10 may be configured in the manner shown in the cross-sectional views of FIGS. 3, 4B, 5B, and 6-9.

Figure 11:
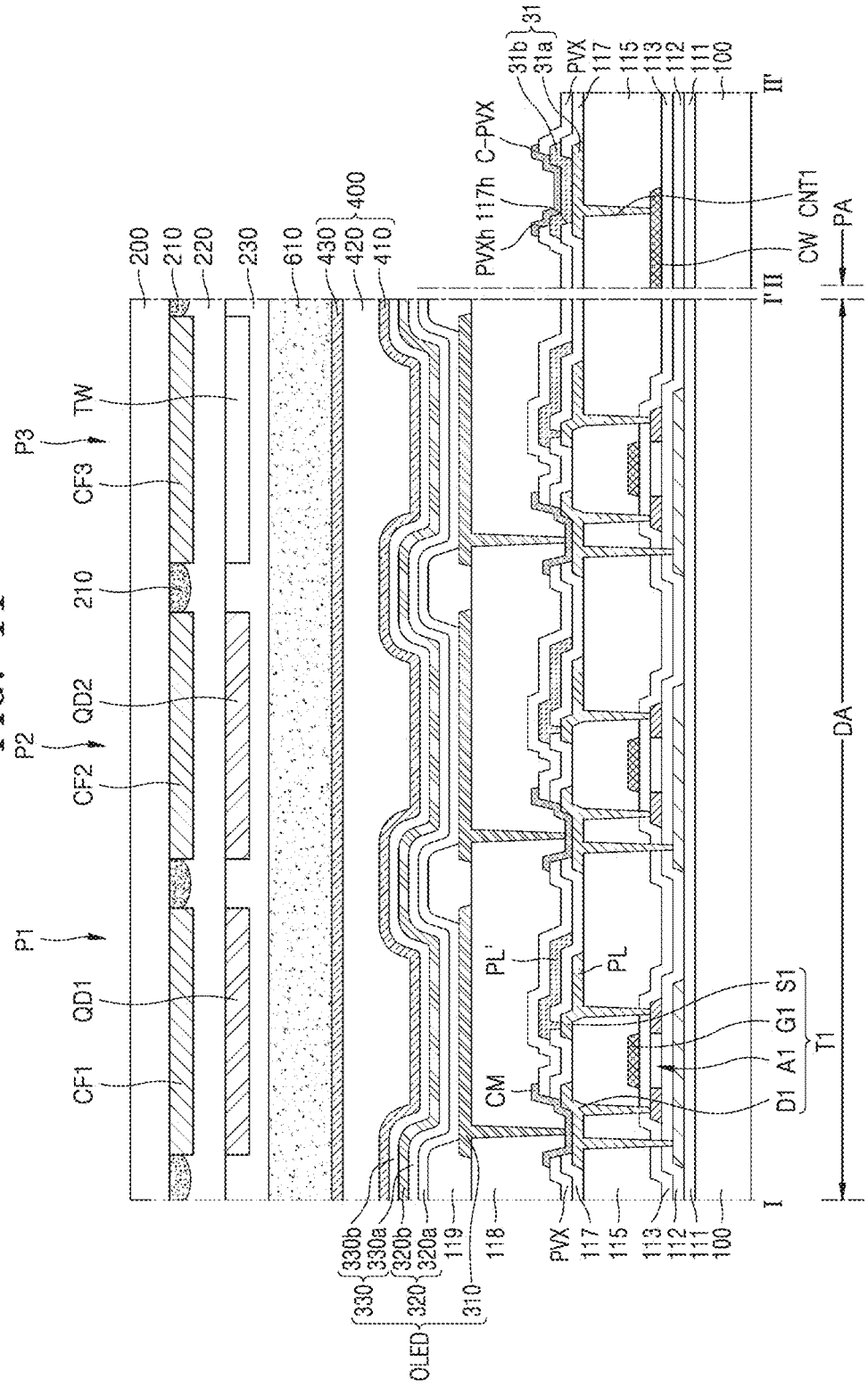
FIG. 11 is a schematic cross-sectional view of a display device according to an exemplary embodiment.

FIG. 11 is a schematic cross-sectional view of a display device according to an exemplary embodiment. In FIG. 11, the same reference numerals as those in FIG. 10 refer to the same members. Accordingly, for convenience of explanation, a redundant description thereof will be omitted.

In an exemplary embodiment according to FIG. 11, in the organic light-emitting diodes OLED included in the plurality of pixels P1, P2, and P3, a plurality of intermediate layers 320a and 320b and a plurality of opposite electrodes 330a and 330b may be stacked.

For example, the organic light-emitting diode OLED may include a first intermediate layer 320a, a first opposite electrode 330a, a second intermediate layer 320b, and a second opposite electrode 330b sequentially stacked on the pixel electrode 310. The first intermediate layer 320a and the second intermediate layer 320b may include an organic emission layer including a fluorescent or phosphorescent material emitting red, green, blue, or white light. The organic emission layer may include a low-molecular-weight material or a polymer material, and functional layers such as, for example, the HTL, the HIL, the ETL, or the EIL may be selectively arranged below or above the organic emission layer. In exemplary embodiments, the first intermediate layer 320a and the second intermediate layer 320b may include an organic emission layer emitting blue light.

The first opposite electrode 330a and the second opposite electrode 330b may include a transmissive electrode or a reflective electrode. In exemplary embodiments, the opposite electrode 330 may include a transparent or a semi-transparent electrode, and may include a metal thin film having a small work function and including, for example, Li, Ca, LiF/Ca, LiF/Al, Al, Ag, Mg, or a compound thereof. In addition, the TCO film such as, for example, ITO, IZO, ZnO, or $In_2O_3$ may be further arranged on the metal thin film. The first opposite electrode 330a may be a floating electrode.

The first intermediate layer 320a, the second intermediate layer 320b, the first opposite electrode 330a, and the second opposite electrode 330b may be formed as a single body with respect to the plurality of pixels P1, P2, and P3.

In exemplary embodiments, first through third color filters CF1, CF2, and CF3 may be included on the upper substrate 200. The first through third color filters CF1, CF2, and CF3 may implement a full color image, improve color purity, and improve outdoor visibility.

The first through third color filters CF1, CF2, and CF3 may be arranged on the upper substrate 200 to correspond to the emission areas of the pixels P1, P2, and P3, respectively. The light blocking pattern 210 may be arranged between the first through third color filters CF1, CF2, and CF3.

A protective layer 220 may cover the light blocking pattern 210 and the first through third color filters CF1, CF2, and CF3. The protective layer 220 may include an inorganic material such as, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The protective layer 220 may include an organic material such as, for example, polyimide or epoxy.

The first color converting layer QD1, the second color converting layer QD2, and the transmission window TW may respectively overlap the first color filter CF1, the second color filter CF2, and the third color filter CF3 with the protective layer 220 between the first color converting layer QD1 and the first color filter CF1, between the second color converting layer QD2 and the second color filter CF2, and between the transmission window TW and the third color filter CF3. An additional protective layer 230 may be further included above the upper substrate 200 to cover the first color converting layer QD1, the second color converting layer QD2, and the transmission window TW. The additional protective layer 230 may include an organic material or an inorganic material.

The first color converting layer QD1 and the second color converting layer QD2 may include quantum dots emitting colors different from each other. For example, the first color converting layer QD1 may emit red light, and the second color converting layer QD2 may emit green light. In addition, the transmission window TW may transmit blue light emitting from the organic light-emitting diode OLED of the third pixel P3.

In this case, the first color filter CF1 may be a red color filter, the second color filter CF2 may be a green color filter, and the third color filter CF3 may be a blue color filter.

According to exemplary embodiments, the pad 31 and related layers as shown in the peripheral area PA in the cross-sectional view of FIG. 11 may be configured in the manner shown in the cross-sectional views of FIGS. 3, 4B, 5B, and 6-9.

The display device according to exemplary embodiments may be applied to a display device having a large area. Accordingly, lines and pads included in the display device may include a metal having high electrical conductivity. Since the metal having high electrical conductivity is likely to be damaged and oxidized during certain processes, according to the exemplary embodiments described herein, a highly reliable display device may be provided by introducing a first insulating layer and a second conductive layer that protect the lines and pads.

Figure 12A:
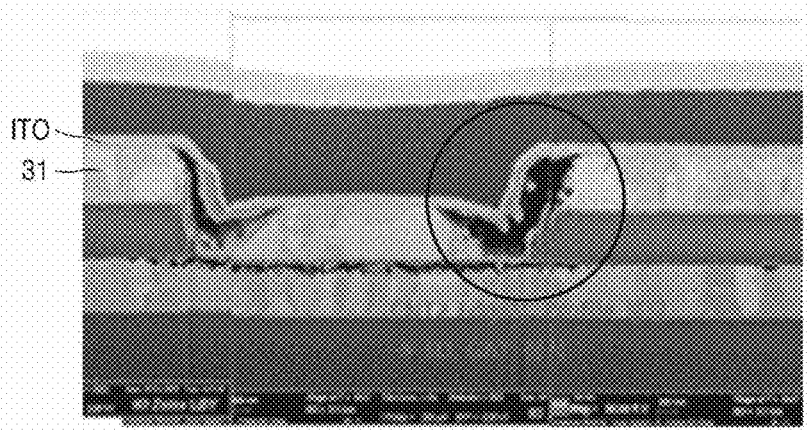
FIGS. 12A and 12B respectively show experimental examples in which indium tin oxide (ITO) and titanium (Ti) were respectively formed on an upper portion of a pad.
Figure 12B:
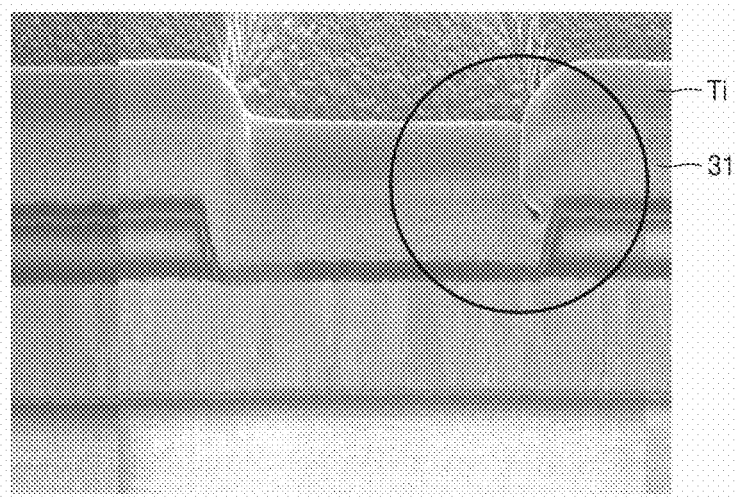

FIGS. 12A and 12B are images comparing a case in which ITO is formed on the pad 31 (FIG. 12A) and a case in which Ti is formed on the pad 31 (FIG. 12B).

Referring to FIG. 12A, when ITO is formed on the pad 31 and a subsequent process is performed, it can be seen that the pad 31 is damaged due to an etchant being injected through a pinhole formed in the ITO.

FIG. 12B shows an image in which Ti is formed on the pad 31. When Ti is formed on the pad 31 and a subsequent process is performed, it can be seen that the pad 31 is not damaged.

As described above, the display device according to one or more exemplary embodiments includes a second conductive layer, and thus, a high quality image may be realized.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:
1. A display device, comprising:
a substrate comprising a display area and a peripheral area outside the display area;
a thin-film transistor arranged in the display area;
a display element arranged in the display area;
an interlayer insulating layer covering the thin-film transistor;
a conductive layer arranged above the interlayer insulating layer;
a first insulating layer covering the conductive layer;
a pad arranged in the peripheral area; and
a second conductive layer covering a central portion of the pad,
wherein the pad is connected to a connection line through a contact hole, and the connection line is arranged on a same first layer as a gate electrode of the thin-film transistor, and
a side surface of the pad is covered by the first insulating layer or the second conductive layer.
2. The display device of claim 1, wherein
the pad comprises a first pad layer on a same second layer as a source electrode of the thin-film transistor, and a second pad layer on a same third layer as the conductive layer,
the first insulating layer includes inorganic material, the first insulating layer has an opening hole exposing a central portion of the second pad layer, and
the second conductive layer is in contact with the second pad layer through the opening hole of the first insulating layer.
3. The display device of claim 1, wherein
the second conductive layer comprises titanium (Ti).
4. The display device of claim 1, wherein
the pad comprises a metal having higher electrical conductivity than that of the second conductive layer.
5. The display device of claim 1, further comprising:
a connection electrode connecting a drain electrode of the thin-film transistor to a pixel electrode of the display element,
wherein the connection electrode comprises a same material as the second conductive layer.
6. The display device of claim 1, wherein
the pad comprises a first pad layer on a same second layer as a source electrode of the thin-film transistor,
the first insulating layer and the interlayer insulating layer comprise opening holes corresponding to a central portion of the first pad layer, and
the second conductive layer is in contact with the first pad layer through the opening holes of the first insulating layer and the interlayer insulating layer.
7. The display device of claim 1, wherein
the pad comprises a first pad layer on a same second layer as a source electrode of the thin-film transistor,
the second conductive layer is arranged on the first pad layer, and the first insulating layer and the interlayer insulating layer cover side surfaces of the second conductive layer and the first pad layer.

8. A display device, comprising:
a substrate comprising a display area and a peripheral area outside the display area;
a thin-film transistor arranged in the display area;
a display element arranged in the display area;
a pad arranged in the peripheral area; and
a second conductive layer covering a side surface and an upper surface of the pad,
wherein the pad is connected to a connection line through a contact hole, and the connection line is arranged on a same first layer as a gate electrode of the thin-film transistor.

9. The display device of claim 8, wherein
the second conductive layer comprises titanium (Ti).

10. The display device of claim 8, further comprising:
a storage capacitor arranged in the display area,
wherein a first electrode of the storage capacitor is arranged on the same first layer as the gate electrode of the thin-film transistor, and a second electrode of the storage capacitor is arranged on a same second layer as a source electrode of the thin-film transistor.

11. The display device of claim 8, further comprising:
a conductive layer arranged above the thin-film transistor,
wherein a first pad layer on a same second layer as a source electrode of the thin-film transistor, and a second pad layer on a same third layer as the conductive layer, are stacked in the pad.

12. A display device, comprising:
a lower substrate comprising a display area and a peripheral area outside the display area;
a plurality of pixels arranged in the display area, each comprising a thin-film transistor and an organic light-emitting diode;
a thin-film encapsulation layer covering the organic light-emitting diodes, and comprising at least one inorganic encapsulation layer and at least one organic encapsulation layer;
an upper substrate arranged above the thin-film encapsulation layer and facing the lower substrate;
a pad arranged in the peripheral area;
a second conductive layer covering a central portion of the pad,
wherein a side surface of the pad is covered by the second conductive layer or a first insulating layer; and
a plurality of color converting layers arranged on the upper substrate and corresponding to at least a portion of the plurality of pixels, and comprising a plurality of quantum dots.

13. The display device of claim 12, wherein
the pad is connected to a connection line through a contact hole, and the connection line is arranged on a same layer as gate electrodes of the thin-film transistors.

14. The display device of claim 12, wherein
the second conductive layer comprises titanium (Ti).

15. The display device of claim 12, further comprising:
a connection electrode connecting the thin-film transistor and a pixel electrode of the organic light-emitting diode in each of the pixels,
wherein the connection electrode comprises a same material as the second conductive layer.

16. The display device of claim 12, wherein
the plurality of pixels comprises a first pixel, a second pixel, and a third pixel,
one of the color converting layers corresponding to the first pixel emits a red light,
one of the color converting layers corresponding to the second pixel emits a green light, and
none of the color converting layers are arranged in correspondence with the third pixel.

17. The display device of claim 12, further comprising:
a plurality of color filters arranged on the upper substrate and corresponding to the plurality of pixels.

18. The display device of claim 12, wherein
the organic light-emitting diodes comprised in the plurality of pixels emit a blue light.

19. A display device, comprising:
a lower substrate comprising a display area and a peripheral area outside the display area;
a plurality of pixels arranged in the display area, each comprising a thin-film transistor and an organic light-emitting diode;
a thin-film encapsulation layer covering the organic light-emitting diodes, and comprising at least one inorganic encapsulation layer and at least one organic encapsulation layer;
an upper substrate arranged above the thin-film encapsulation layer and facing the lower substrate;
a pad arranged in the peripheral area;
a second conductive layer covering a central portion of the pad,
wherein a side surface of the pad is covered by the second conductive layer or a first insulating layer; and
a conductive layer arranged on the thin-film transistors and connected to the thin-film transistors through contact holes.

* * * * *